(12) United States Patent
Johnson

(10) Patent No.: US 7,317,902 B2
(45) Date of Patent: Jan. 8, 2008

(54) SUCCESSIVE LOG VIDEO PAD POWER DETECTOR AND METHOD

(75) Inventor: Kent Johnson, South Lake Tahoe, CA (US)

(73) Assignee: Harris Corporation, Melbourne, FL (US)

( * ) Notice: Subject to any disclaimer, the term of this patent is extended or adjusted under 35 U.S.C. 154(b) by 1021 days.

(21) Appl. No.: 09/893,009

(22) Filed: Jun. 28, 2001

(65) Prior Publication Data

US 2003/0003885 A1    Jan. 2, 2003

(51) Int. Cl.
*H04B 1/04* (2006.01)
*H01Q 11/12* (2006.01)

(52) U.S. Cl. .................... 455/127.1; 333/279; 333/310

(58) Field of Classification Search ............. 455/249.1, 455/253.1, 253.2; 333/109, 138, 310, 279
See application file for complete search history.

(56) References Cited

U.S. PATENT DOCUMENTS

| | | | |
|---|---|---|---|
| 3,303,596 A * | 2/1967 | Lewis et al. ................ | 43/41.2 |
| 3,435,353 A | 3/1969 | Sauber | |
| 3,742,391 A * | 6/1973 | Smith ......................... | 333/100 |
| 4,310,812 A | 1/1982 | DeBloois | |
| 4,758,793 A | 7/1988 | Sheade et al. | |
| 4,794,325 A | 12/1988 | Britton et al. | |
| 4,806,888 A * | 2/1989 | Salvage et al. ............. | 333/138 |
| 4,873,484 A | 10/1989 | Adam et al. | |
| 4,968,901 A | 11/1990 | Shacter | |
| 4,998,078 A * | 3/1991 | Hulkko ....................... | 333/109 |
| 5,126,686 A | 6/1992 | Tam et al. | |
| 5,126,688 A * | 6/1992 | Nakanishi et al. .......... | 330/285 |
| 5,262,741 A | 11/1993 | Kitakubo | |
| 5,347,239 A | 9/1994 | Loehner et al. | |
| 5,351,013 A | 9/1994 | Alidio et al. | |
| 5,381,115 A | 1/1995 | Timmons et al. | |
| 5,530,922 A | 6/1996 | Nagode | |
| 5,790,943 A | 8/1998 | Fotowat-Ahmady et al. | |
| 5,854,971 A | 12/1998 | Nagoya et al. | |
| 5,918,166 A * | 6/1999 | Tsumura ................... | 455/249.1 |
| 6,108,527 A | 8/2000 | Urban et al. | |
| 6,204,727 B1 | 3/2001 | Wey et al. | |
| 6,229,375 B1 | 5/2001 | Koen | |
| 6,708,022 B1 * | 3/2004 | Kurokawa et al. ............ | 257/24 |
| 6,756,849 B2 * | 6/2004 | Dupuis et al. .............. | 330/279 |

FOREIGN PATENT DOCUMENTS

| | | |
|---|---|---|
| EP | 0320265 | 6/1989 |
| GB | 2350955 | 12/2000 |
| JP | 11127084 | 5/1999 |

\* cited by examiner

*Primary Examiner*—Joy K. Contee
(74) *Attorney, Agent, or Firm*—Duane Morris LLP

(57) ABSTRACT

A power detector which samples the output signal from a communications device and produces a control signal proportional to the transmit power level, comprising a series of diode detectors where the sampled signal is divided between the diode detectors by an attenuator cascade.

17 Claims, 3 Drawing Sheets

SUCCESSIVE LOG VIDEO PAD POWER DETECTOR AND METHOD

BACKGROUND OF INVENTION

Applicant's disclosure is directed to an improved method and system for controlling the transmit power level in a communication device. Specifically, applicant's disclosure is directed to a power detector having an improved dynamic power range that is less complex and cheaper to construct than conventional power detectors having a similar power range.

The use of signal amplifiers in radio communications is well known. For hand held communication devices, federal regulations, collision avoidance and battery power conservation are factors which dictate tight control over the transmitted power level of the RF signals, the goal being to transmit at sufficient power to ensure reliable reception of the transmitted signal while avoiding unnecessary drain on battery resources and avoiding signal collision with other communication devices.

A conventional method for determining transmit signal power level is to use a simple single stage diode envelope detector. FIG. 1 is a simplified diagram of one such prior art power detector. An RF input signal is received by the power control circuit 10 where the signal is amplified or attenuated as necessary and then sent to antenna 12 where the RF output signal is transmitted. Prior to transmission, the RF output signal is sampled by a coupler 14. The coupler 14 provides the sampled signal to the diode detector 16. Detector 16 generates a signal (normally DC volts) which is proportional to the output power of the RF suit signal. The detector signal is then compared at comparator 18 against a reference signal which corresponds to the desired output power level of the transmitter. The output of the comparator 18 drives the amplification/attenuator network 10 which either increases or decreases the power level as necessary to control the transmit power level.

The single diode detector is simple and cheap method of power control in communication devices. However, there are several limitations to the diode detector which may effect product performance and add costs to the power detector.

The simple diode detector has a narrow practical operating power range. The nonlinear response of the diode detector is a square law function, not a log-linear detector. Though a square law curve is not a bad approximation for a log-linear curve over a small operating range, wide dynamic ranges present the need for a level dependent correction factor. For example and with Reference to FIG. 2, at high powers 1.000 volt might represent a 5 dB change in power, where at low powers 0.010 volts might represent the same 5 dB Thus, for the lower signal levels sensitivities of 2 mV/dB are not uncommon. To maintain a 10 dB signal to noise ratio the noise floor must be below 2001 mV—a level difficult to achieve in a noisy environment.

Additionally, a 10 to 15 dB dynamic range is all that is useable, because the detector's non-linear response rapidly drops the detected output voltage for low power input signals making noise immunity an issue.

Another important concern is that the repeatability of the signal diode detector curve is not very good, which is critical if multiple diodes are used together. The curves are a strong function of the doping gradients in the semiconductor, the load presented to the diode and the temperature of operation. It is possible to control the load fairly consistently, however the doping gradients vary as a function of many processing steps, which are difficult to control. Even if diodes were matched and loads were controlled carefully, the curves vary significantly with temperature.

Changes in ambient temperature in the environment of the diode can significantly change the output of the diode. The temperature effect on a diode detector are quite pronounced and attributable primarily to changes in the forward barrier and video resistance. Unfortunately, neither property is easily controlled and thus it is usually necessary to use some sort of temperature compensation circuit to remove the effects of temperature from the output of the diode detector.

In summary a single diode detector only has a narrow power range where repeatable, stable, good signal to noise measurements can be made. For wide dynamic ranges (40 dB) another solution must be sought.

The Successive Log Video Amplifier (SLVA) concept has been around for many years and provides an accurate log-linear response over very wide dynamic ranges. The SLVA utilizes a series of diode detectors, with each detector operating in a narrow power range. The detectors only receive a portion of the sampled signal and the output of the detectors must be summed to provide an accurate representation of the transmit signal level. The use of a series of diode detectors requires that the sampled signal be divided among the detector. The SLVA uses a amplifier cascade to provide portions of the sampled signal to the detectors.

The SLVA is built from a successive cascade of very carefully gain-matched amplifiers. Between each amplifier a simple diode detector is placed. Each amplifier typically has a gain of about 10 dB. Thus, the diode detectors only need to detect power over the range where the detector is well behaved and has good noise immunity. The outputs of the detectors are then summed together in such a way to produce a close approximation to a log-linear response. SLVA's are commonly available with ten plus stages with accuracy being better than 1 dB over a 100 dB dynamic range.

With the exception of a few monolithic designs, SLVA's are however typically very expensive. The reason for the high cost is the need for very accurate gain matching. This matching requires high skilled labor and significant tuning time. Higher frequency applications require closer matching thus increasing the costs even further. For example, at microwave frequencies, each stage must be gain matched to often better than 1 dB.

Thus, the concept of using a series of amplifiers with detectors operating over a narrow range and summing the detectors works well for low power signals and thus the SLVA is almost always used for detecting very low power signal levels. This device is commonly used in both radar systems and spectrum analyzers and recently this technology has been applied via a monolithic device from Analog Devices. However, such monolithic devices are not available above 3 GHz or above +10 dB and although not as expensive as traditional gain matched amplifier cascade, monolithic devices still require significant development costs.

Recently communication devices operating in the very high frequency (VHF) spectrum have been made available for commercial use, e.g. milimeter wave systems. Such high frequency systems are susceptible to significant signal degradation due to atmospheric conditions. For examples, very high frequency signals suffer significant attenuation during rain storms. One method of mitigating this rain attenuation effect is to increase the power level of the transmitted signal in order to "burn" through the signal to the receiving station. When the rain attenuation effect is not present the power level of the transmitted signal can be reduced and thus battery power of the communication device is conserved. Thus, there is a need for a power detector which works over a broad power range, i.e. both high and low power, without the attendant costs and time associated with matched gain filters.

Accordingly, it is an object of the present invention to provide a novel power detector which has a dynamic power range and works at both high and low power.

It is another object of the present invention to provide a novel power detector which can be used at high frequency without the attendant time and costs associated with gain matched filters.

It is yet another objective of the present invention to provide a novel power detector which utilizes low cost reliable diode detectors without an associated amplifier cascade.

It is still another object of the present invention to provide a novel power detector for use with high frequencies at high and low powers without the use of cascaded active elements.

It is yet still another object of the present invention to provide a novel power detector which reduces the costs and time required to manufacture.

It is still another object of the present invention to provide a novel method of generating a power control signal proportional to the transmit power level for high and low power applications.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 3 represents one embodiment of applicant's disclosure. The design consists of five main building blocks, the pie pads 30, diode detectors 32, high impedance buffers 34, saturating gain amplifiers 36 and a summer 38.

THE DETAILED DESCRIPTION

Figure 1:
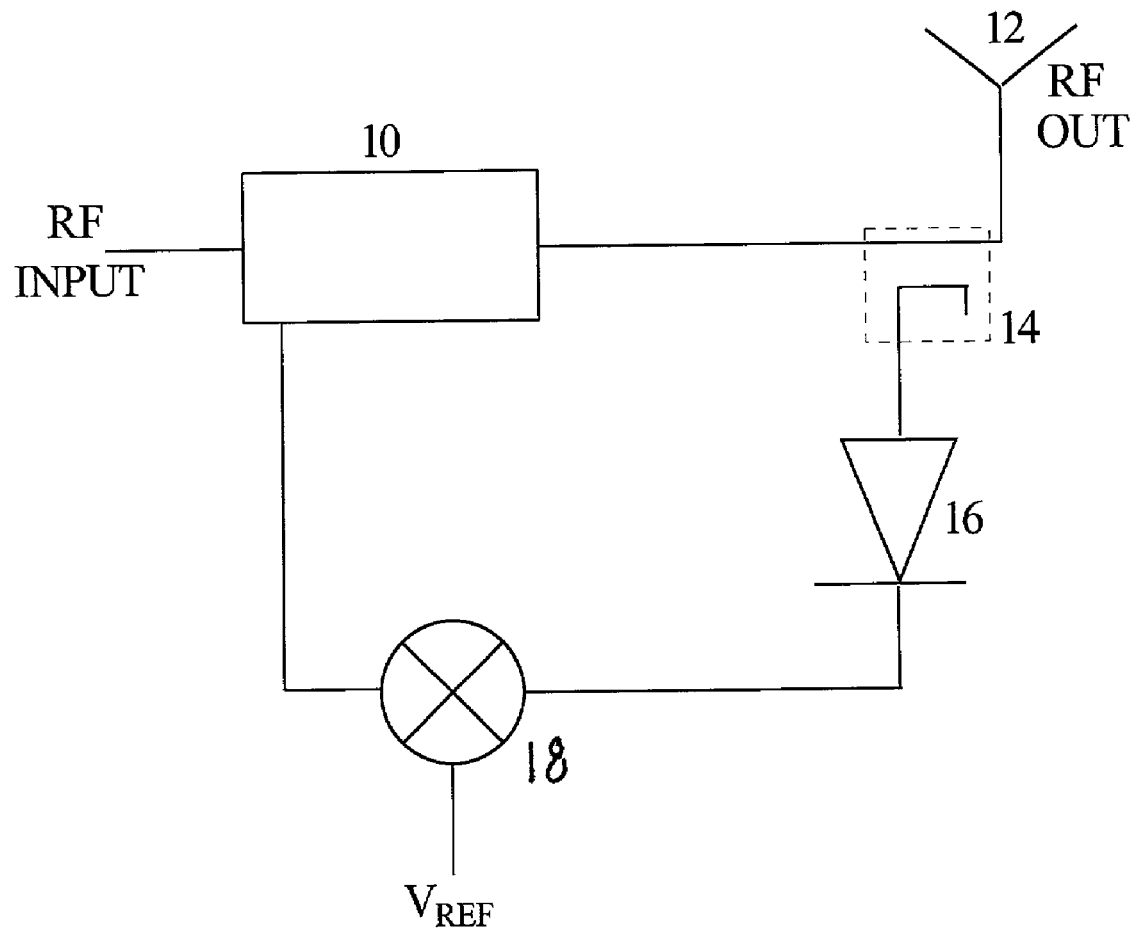
FIG. 1 is a simplified block diagram of a single diode detector.
Figure 2:
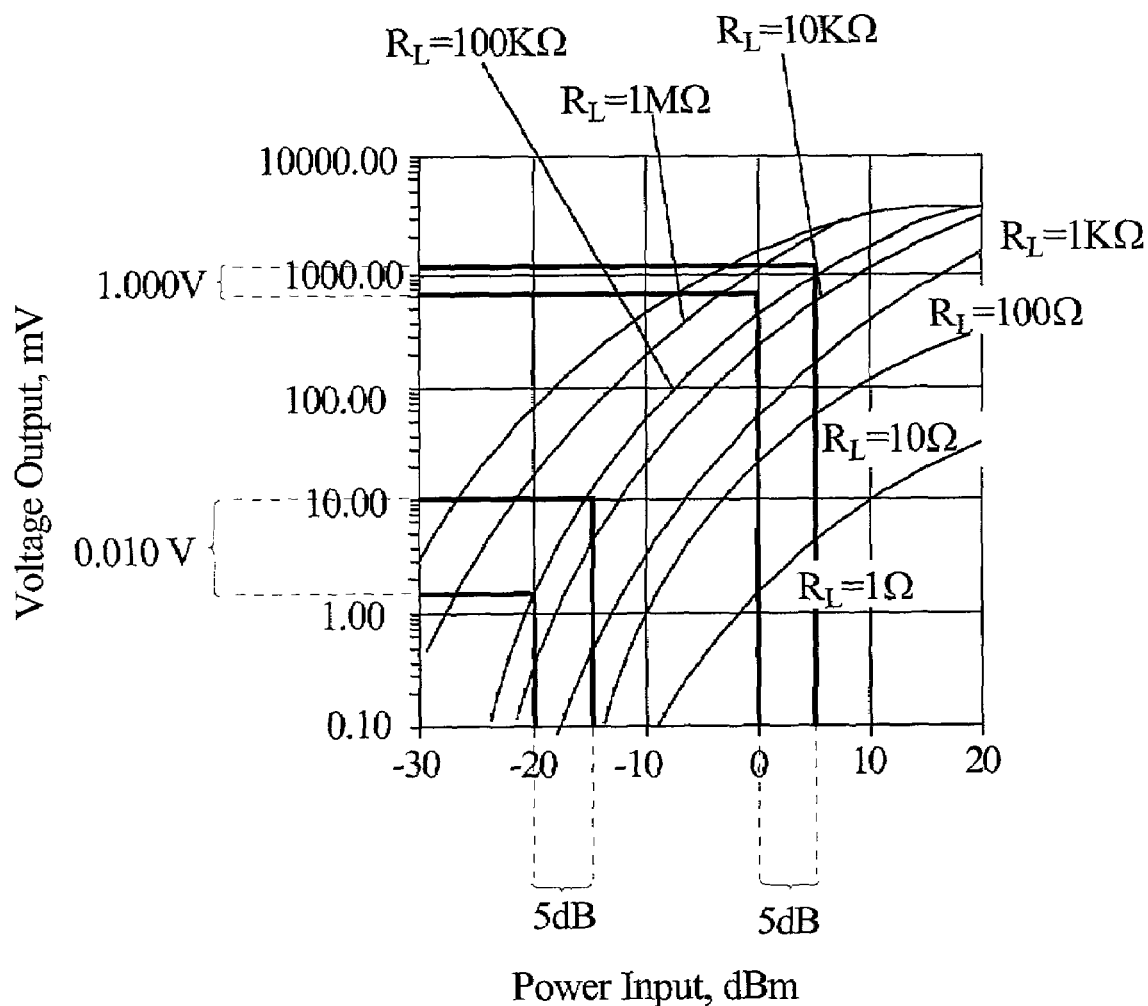
FIG. 2 is a typical operating curve for the single diode detector of FIG. 1.
Figure 3:
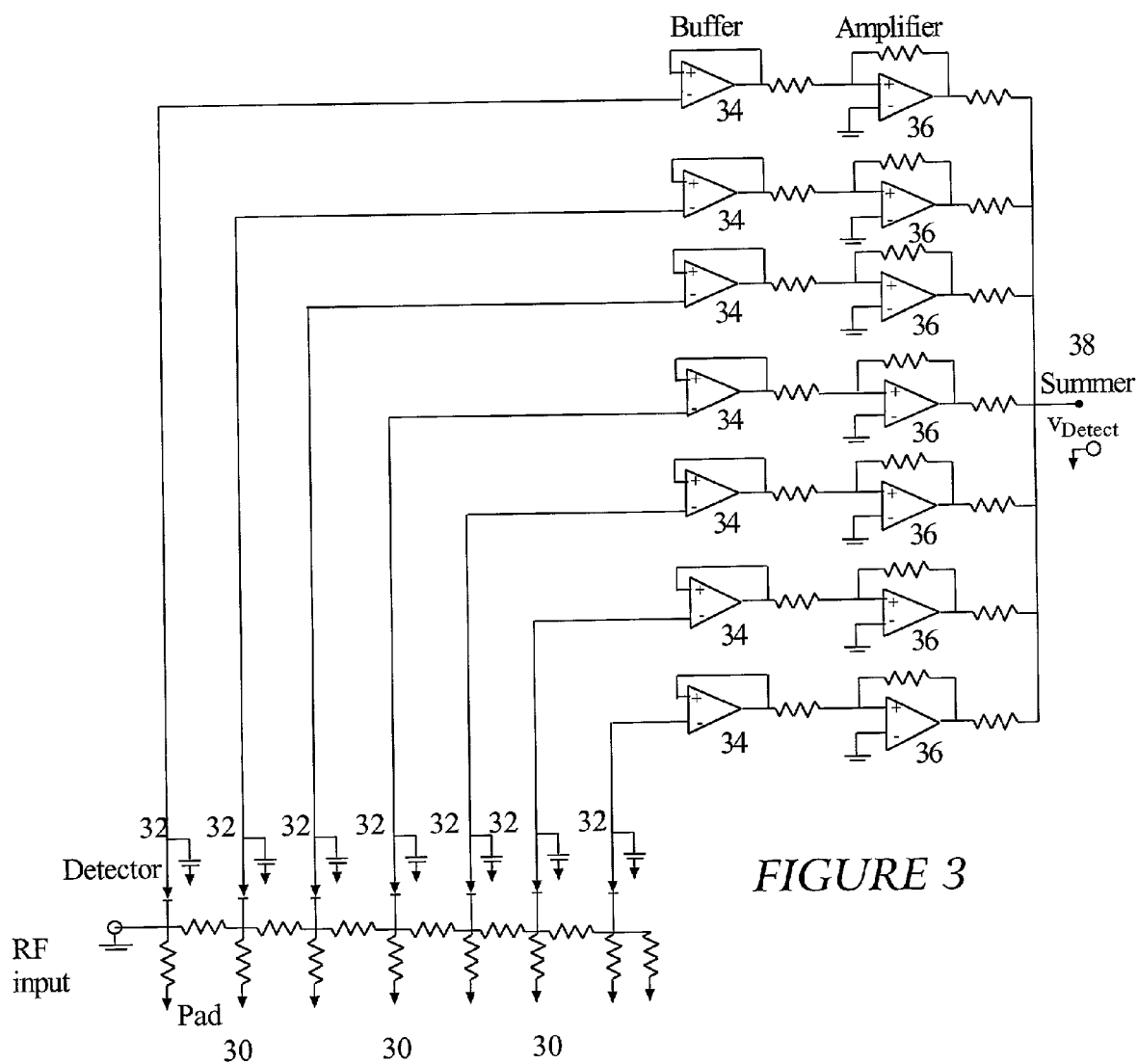
FIG. 3 is a simplified block diagram of the Successive Log Video Pad (SLVP) power detector utilized by the present invention.

A seven stage detector requires a little more than 5 dB dynamic range from each detector stage. It also fits with in the bounds of 4 quad opamp devices (leaving some spare capability for temperature compensation). Such detectors are stable over the entire 5 dB range providing good signal to noise measurements. The detectors may be high sensitivity Zero Bias Diode (ZBD), mounted on top of the integrating capacitor. Bias may not be applied for simplicity and thus the detector stage can be very cheap and accurate.

The pad (attenuator) elements 30 may be discrete pie pads of 5 dB, each bonded to the inside of a carrier module. The pads 30 may be a monolithic thin film part and thus would have the ratio-metric properties of the mask. The shunt ground connection on the pad may be achieved via a wide trace and wire bond and assists in increasing the bandwidth of the device. The passive nature of the RF cascade in the present embodiment is unconditionally stable as compared with the active nature of the amplifier cascade in the prior art SLVA. Additionally, a thin film pad is much smaller than the equivalent gain delta amplifier.

With respect to practical limitations, the realizable gain delta in applicant's disclosure can be very small relative to the practical gain delta of a prior art video amplifier. For example, a 2 dB pad cascade is easily realized with thin film technology for pennies, but a 2 dB amplifier cascade, though do-able, is very impractical. Amplifier gain blocks tend to come in 8 to 14 dB steps, making additional padding necessary to achieve small sizes. Thus, the very fine, ultra log-linear 2 dB steps are expensive to realize with amplifiers.

The ratio-metric precision of a thin film, thick film or semiconductor resistor mask can produce near perfect log-linear responses. This near identical gain delta between detectors along the pad cascade gives applicant's disclosure excellent performance without the need for adjustment and without the need for gain matched amplifiers that have limited bandwidth and power capability.

The broad band nature of the attenuators of applicant's disclosure provide unusually wide bandwidth capability. Currently prior art devices are available up to 3 GHz with ±1 dB non-tunable accuracy at low power. Applicant's disclosure is easily fabricated with standard thin film techniques to work at 40 GHz with the same nontuneable accuracy. The use of cascaded passive elements allows for use with a much broader frequency spectrum and the present embodiment works down to DC which conventional SLVA's can not do.

A buffer 34 may be placed after the detector to insure high DC input impedance. This reduces the effect of the diode video resistance and improves sensitivity.

A high gain operational amplifier (opamp) ($A_v$=400) 36 may be used to provide gain and the limiting function necessary for equal gain log-linear summing. Opamps provide low input offset drift and saturation characteristics. Unlike the SLVA's which use the saturation of the video amplifier, the present embodiment uses the saturation of op-amp 36 to limit the contribution of each stage.

The independent nature of each high gain opamp 36 allows superposition to be used for summing, yielding a simple resistive summer 38. Unlike the traditional SLVA, the present embodiment uses purely passive summing of the detector 32 outputs. Because of the opamp saturation requirement to provide the truncation of the detector range, the opamp 36 is configured for high gain and high isolation. This allows for simple superposition of the op-amps' output sources to do the summing.

The opamps 36 may be procured on a single monolithic substrate. The saturation of the opamps 36 is more predictable, abrupt and controllable than the RF saturation characteristics of the video amplifiers typically used in the SLVA.

Typical log-linear errors for the present embodiment at 25° C. are less than 1.0 dB over all but the extremes of the power range. A thermistor compensation circuit (not shown) could implement simple temperature linear correction using the two unused opamps.

In another embodiment of the applicant's disclosure, a single amplifier added before the attenuator cascade allows the for accurate and cheap power detection at low powers. Because applicant's disclosure can deliver excellent log-liner response over a 40 dB range without tuning, it is less expensive to add a single gain stage before the cascaded pads to extend the detection range lower than to utilize a gained matched video amplifier cascade as taught in the prior art.

Thus applicant's disclosure provides an easier, less costly, faster, broader band way to make a precision matched, temperature stable attenuator cascade for use to detect transmit power levels in high and low frequency and high and low power applications than taught in the prior art.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. In a power detector for a radio frequency wireless communications transmitter with a controllable transmitted power level in which a sampled signal is provided via a plurality of matched cascaded elements to a plurality of diode detectors, the output signals from which are summed to provide a control signal for the transmitted power level, the improvement wherein the cascaded elements are passive.

2. The power detector of claim 1 wherein said cascaded elements are attenuators.

3. The power detector of claim 1 further comprising an amplifier upstream of said cascaded attenuators.

4. A power detector for controlling the transmit power level of a communications device comprising:
   plural cascaded attenuators for receiving a signal representative of the transmit power level of a communication device and for providing plural attenuator output signals, wherein the cascaded attenuators are passive elements;
   plural diode detectors each receiving one of the plural attenuator out signals to thereby providing plural detected signals;
   a summer responsive to the plural detected signals for producing a control signal having a voltage proportional to the power transmit power level of the communications device; and
   a control unit for adjusting the transmit power level responsively to the control signal.

5. The power detector of claim 4 wherein said plural attenuators further comprise a printed thin film successive pad cascade.

6. The power detector of claim 4 wherein said plural attenuators each have substantially the same ratio-metric properties.

7. The power detector of claim 4 further comprising plural buffers connected one each between one of said plural detectors and said summer to thereby increase the d.c. input impedance and improve the sensitivity of the power detector.

8. The power detector of claim 4 further comprising plural high gain operational amplifiers connected one each between each of said buffers and said summer.

9. The power detector of claims 8 wherein said plural operational amplifiers include portions of a common monolithic substrate.

10. The power detector of claim 4 further comprising an amplifier for the signal representative of the transmit power level upstream of said plural attenuators.

11. A power detector for controlling the transmit power level of a communications device comprising:
   means for providing a power level signal representative of the transmit power level of the communication device;
   passive means for dividing the power level signal into plural power level signals;
   means for detecting a characteristic of each of the plural power level signals to thereby provide plural detected signals; and
   means for summing the plural detected signals to thereby provide a control signal.

12. A power level control circuit for a communications device comprising:
   a communications device having a transmitted power level control;
   a detector for providing a power level signal representative of the transmit power level of said communication device;
   a passive signal divider for dividing the power level signal into plural power level signals;
   a unidirectional circuit for detecting a characteristic of each of the plural power level signals to thereby provide plural detected signals;
   an adder for summing the plural detected signals to thereby provide a control signal to said power level control.

13. In a method of detecting the transmit power level of a communication device wherein a signal related to the signal transmitted by the communication device is divided by a plurality of cascaded elements into plural components, and wherein a characteristic of the components is detected and summed to provide a signal related to the power level of the communications device, the improvement wherein the division is accomplished using only passive circuit elements.

14. A method of controlling the transmit power level of a communication device comprising the steps of:
   a. providing a power level signal representative of the power level of the signal transmitted by the communication device;
   b. attenuating the power level signal with a successive cascade of passive attenuators to thereby provide a plurality of attenuator signals;
   c. detecting a characteristic of each of the plurality of attenuator signals to thereby provide plural detector signals;
   d. summing the detector signals to provide a control signal; and
   e. controlling the transmit power level of the communications device responsively to the control signal.

15. The method of claim 13 further comprising the step of amplifying the power level signal prior to dividing the power level signal.

16. The method of claim 13 further comprising the step of amplifying each of the detector signals prior to summing.

17. In a method of controlling the power level of a radio frequency transmitter wherein the level of power is detected by sampling the transmitted signal, the sampled signal is divided, a characteristic of each of the divided signals is detected by a unidirectional device, and the detected signals are summed to provide a control signal, the improvement wherein the sampled signal is divided prior to detection without using active circuit elements.

* * * * *

UNITED STATES PATENT AND TRADEMARK OFFICE
CERTIFICATE OF CORRECTION

| | | |
|---|---|---|
| PATENT NO. | : 7,317,902 B2 | |
| APPLICATION NO. | : 09/893009 | |
| DATED | : January 8, 2008 | |
| INVENTOR(S) | : Kent Johnson | |

It is certified that error appears in the above-identified patent and that said Letters Patent is hereby corrected as shown below:

Column 1, line 3 insert:

--CROSS-REFERENCE TO RELATED APPLICATIONS

This application claims the benefit of U.S. Provisional Application Serial No. 60/221,516 filed on July 28, 2000.--

Signed and Sealed this

Seventh Day of October, 2008

JON W. DUDAS
*Director of the United States Patent and Trademark Office*